US008443330B2

(12) United States Patent
Amrutur et al.

(10) Patent No.: US 8,443,330 B2
(45) Date of Patent: May 14, 2013

(54) METHODS AND SYSTEMS FOR MEASURING AND REDUCING CLOCK SKEW USING A CLOCK DISTRIBUTION NETWORK

(75) Inventors: Bharadwaj Amrutur, Bangalore (IN); Pratap Kumar Das, Bangalore (IN)

(73) Assignee: Indian Institute of Science—Bangalore, Karnataka (IN)

( * ) Notice: Subject to any disclaimer, the term of this patent is extended or adjusted under 35 U.S.C. 154(b) by 316 days.

(21) Appl. No.: 12/511,607

(22) Filed: Jul. 29, 2009

(65) Prior Publication Data
US 2011/0025391 A1   Feb. 3, 2011

(51) Int. Cl.
G06F 17/50   (2006.01)

(52) U.S. Cl.
USPC .......... 716/136; 716/108; 716/113; 716/134

(58) Field of Classification Search .......... 716/108, 716/113, 134, 136
See application file for complete search history.

(56) References Cited

U.S. PATENT DOCUMENTS 7,573,957 B2 *  8/2009  Sartschev et al. .......... 375/342
7,933,761 B2 *  4/2011  Hollis .......................... 703/19

OTHER PUBLICATIONS

Friedman, "Clock Distribution Networks in Synchronous Digital Integrated Circuits," Proceedings of the IEEE, vol. 89, No. 5, May 2001.

Mahoney et al., "16.1 Clock Distribution on a Dual-Core, Multi-Threaded Itanium®-Family Processor," IEEE International Solid-State Circuits Conference, Session 16, Feb. 2005.
Lee and Abide, "A 9 b, 1.25 ps Resolution Coarse-Fine Time-to-Digital Converter in 90 nm CMOS that Amplifies a Time Residue," IEEE Journal of Solid-State Circuits, vol. 43, No. 4, Apr. 2008.
Gutnik and Chandrakasan, "On-chip picosecond time measurement," 2000 Symposium on VLSI Circuits Digest of Technical Papers, 2000.
Abas et al., "Built-in time measurement circuits—a comparative design study," IET Comput. Digit. Tech., 1, (2), 2007.
Sanda et al., "WA 21.7 Picosecond Imaging Circuit Analysis of the POWER3 Clock Distribution," 1999 IEEE International Solid-State Circuits Conference, Session 21, 1999.
Zheng and Shepard, "On-Chip Oscilloscopes for Noninvasive Time-Domain Measurement of Waveforms in Digital Integrated Circuits," IEEE Transactions on Very Large Scale Integration (VLSI) Systems, vol. 11, No. 3, Jun. 2003.
Arnaud et al., "Low Cost 65nm CMOS Platform for Low Power & General Purpose Applications," 2004 Symposium on VLSI Technology Digest of Technical Papers, 2004.
Yeh et al., "Clock Distribution Architectures: A Comparative Study," Proceedings of the 7th International Symposium on Quality Electronic Design (ISQED'06), IEEE Computer Society, 2006.
Hoeffding, "Probability Inequalities for Sums of Bounded Random Variables," Journal of the American Statistical Association, vol. 58, No. 301, Mar. 1963.

(Continued)

Primary Examiner — Vuthe Siek
(74) Attorney, Agent, or Firm — Steven S. Rubin, Esq.; Moritt Hock & Hamroff LLP

(57) ABSTRACT

A technique for a delay measurement system to measure the skews in a clock distribution network is presented. It uses the principle of sub-sampling to measure and amplify small clock skews and determine an estimate of clock skew by further manipulation if these sampled measurements. The technique can be applied to measure clock skew on a computer chip, between bit-line of a communication bus, or between elements connected by an electronic or optical interconnect.

19 Claims, 6 Drawing Sheets

OTHER PUBLICATIONS

Das, K.P., et al., "On-Chip Clock Network Skew Measurement using Sub-Sampling," Solid-State Circuits Conference, A-SSCC '08. IEEE Asian, pp. 4, Nov. 3-5, 2008.

* cited by examiner

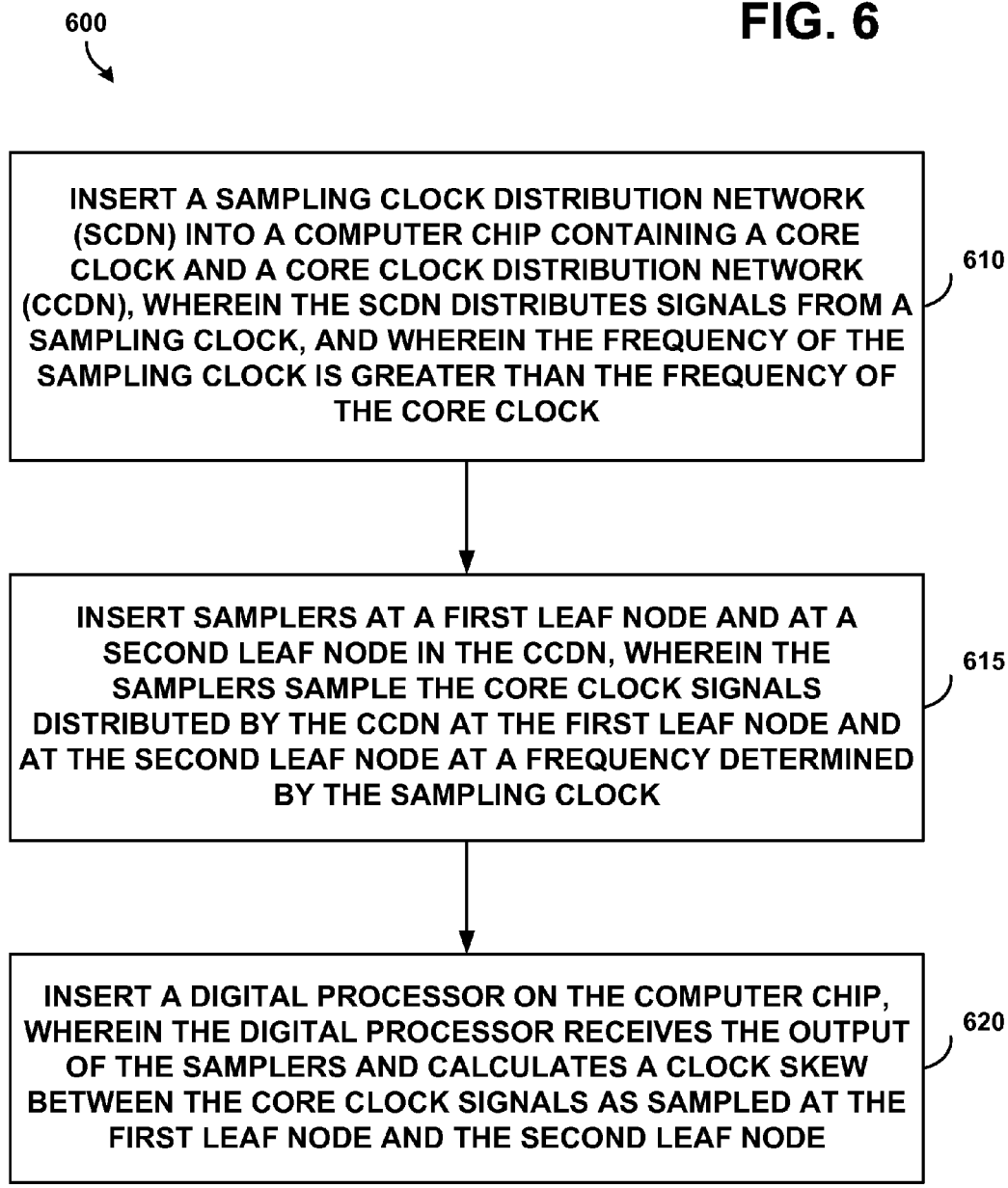

METHODS AND SYSTEMS FOR MEASURING AND REDUCING CLOCK SKEW USING A CLOCK DISTRIBUTION NETWORK

BACKGROUND

Modern synchronous chips use large clock distribution networks spread over a die to distribute a clock to hundreds of thousands of elements. It is desirable for these elements, such logic and memory modules, to be substantially synchronized with one another. Thus, the relative arrival time difference between clock signals at the leaf nodes of a distribution network, the clock skew, directly impacts the timing margins of the chip. Elaborate care is taken to design these distribution networks to minimize clock skew. However, random within-die variations, along with other systematic variations still introduce a residual clock skew in the network.

As clock skew increases, the viable clock speed of the computer chip is reduced, thus also reducing the potential performance of the computer chip. On the other hand, as clock skew decreases, the viable clock speed of the computer chip is increased, thus also increasing the potential performance of the computer chip. Accordingly, it is desirable to reduce clock skew as much as practically possible.

Furthermore, at higher clock frequencies, the sensitivity of the computer chip to clock skew increases. For instance, a clock skew that is acceptable for a computer chip operating at a clock speed of few megahertz may be prohibitively large for a computer chip operating at a clock speed of a few gigahertz. As modern computer chips can operate at clock frequencies in the gigahertz range and higher, the importance of addressing clock skew increases.

Hence, a technique to measure the relative skew between two arbitrary leaf nodes of a clock network will be of great value in studying and characterizing clock skews, as well as potentially enabling a closed loop design of a clock network to reduce clock skew.

Techniques to measure skew between two signals are used in Phase Lock Loops (PLL), Delay Lock Loops (DLL) and Time-to-Digital Converters. PLLs and DLLs use a phase detector followed by a filter which gives a measure of the relative skew between two periodic signals. Time-to-digital converters which multiply time residue for improving the timing resolution have also been proposed.

However, these techniques may be difficult to use to measure the clock skew between two leaf nodes with arbitrary physical separation. This is because it becomes difficult to route these signals from the leaf nodes of the network to a common measurement location without adding yet more skew that corrupts the measurement. Alternative techniques like the PICA method or SEM imaging can be used to measure the clock skew of arbitrary leaf nodes. However these sophisticated techniques require extensive physical modification of the die and package, and are very expensive to use on a large scale.

Accordingly, it is desirable to develop new methods and systems that facilitate low-impact but accurate measurement of clock skew between arbitrary elements.

SUMMARY

In order to reduce clock skew, the sources of clock skew on the computer chip must be discovered. One way of discovering these sources is to measure the clock skew between various pairs of elements on the computer chip to determine which elements are contributing most significantly to clock skew. However, on high-clock-frequency chips, the measured clock skew can be quite small, perhaps in the picosecond (ps) range, but still disruptive. Thus, methods and systems are presented to amplify the measured clock skew between any two elements so that it can be more readily compared to other measured clock skews. Furthermore, methods and systems are presented that provide the measured clock skew to a feedback system. The feedback system may facilitate adjusting the length of any delays in the paths between a core clock and the various elements. By lengthening some of the delays and/or shortening others, clock skew can effectively be reduced.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

FIG. 6 depicts a method for placing a sampling clock distribution network on a computer chip in order to measure clock skew.

DETAILED DESCRIPTION

Figure 1:
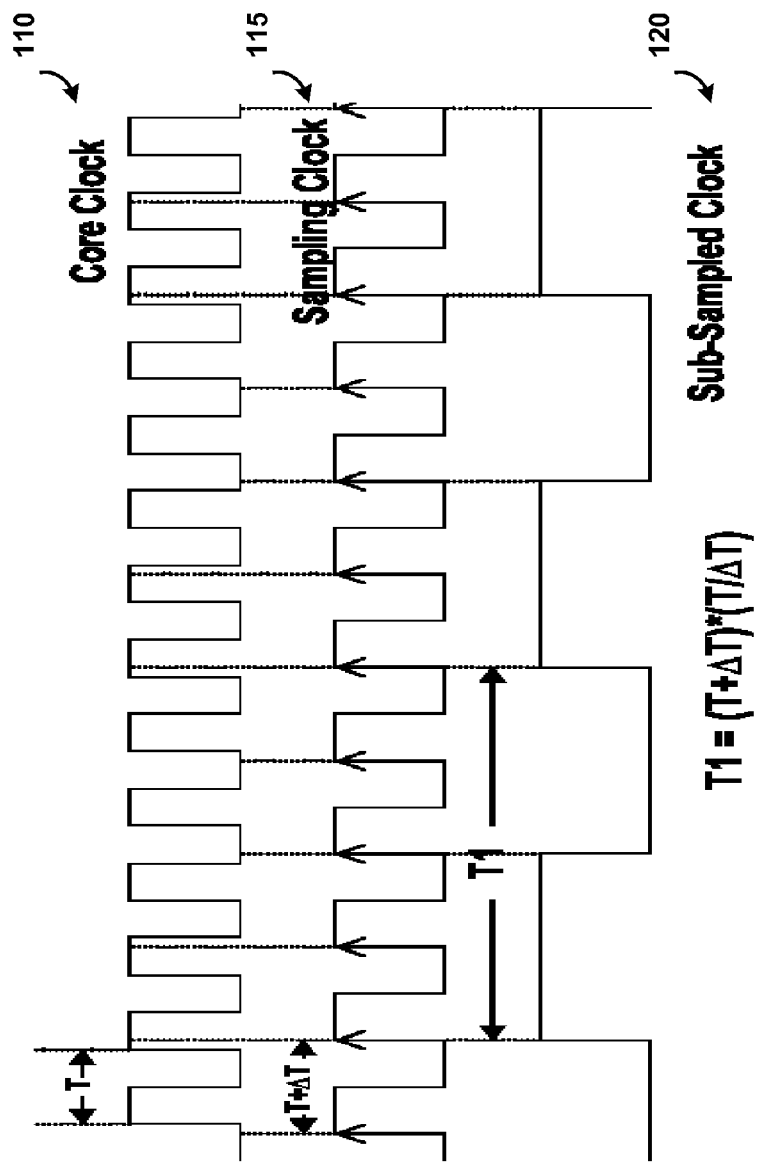
FIG. 1 depicts an example method to produce a sub-sampled clock.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated and make part of this disclosure.

I. Sub-Sampling to Amplify Clock Skew

FIG. 1 contains a core clock signal 110 with period T and a sampling clock signal 115 with period T+ΔT. When a periodic signal with period T is sampled by a signal with a period T+ΔT, and where ΔT is small in comparison to T, the output of the sampler is a periodic beat signal with period ~T2/ΔT. In a sense, the time axis is expanded by a factor of T/ΔT, as is shown by sub-sampled clock 120.

As a corollary, if two signals each of period T, but separated by $T_{skew}$ are sampled by a signal of period T+ΔT, the two beat signals will be separated by $(T_{skew})(T/\Delta T)$. Thus a small skew of $T_{skew}$ can be amplified by a large factor and can be measured with digital techniques. By controlling the ratio T/ΔT, large amplifications can be obtained to measure very small skews.

Figure 2:
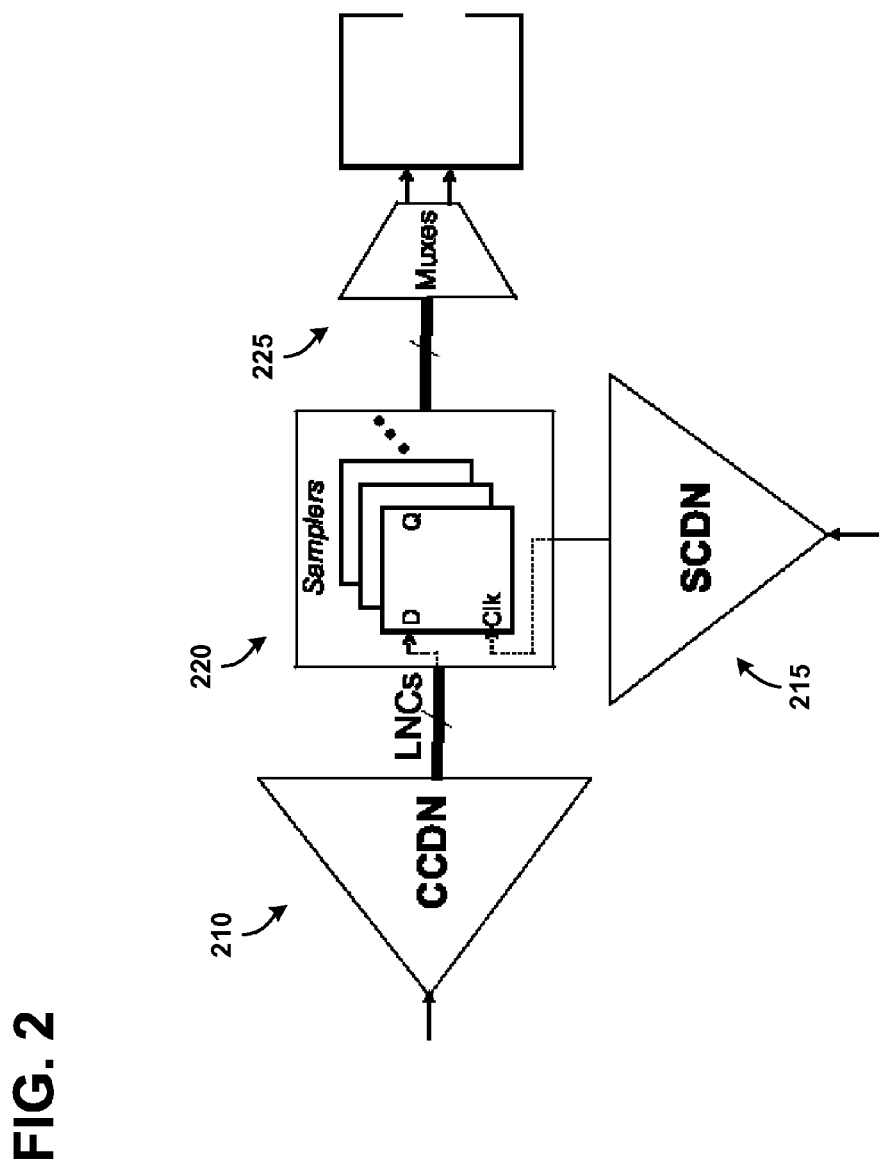
FIG. 2 depicts an example method to sample clock skews at any two leaf nodes in a core clock distribution network.

This principle can be used to make distributed clock skew measurement as shown in FIG. 2. The triangle on the left side represents the core clock distribution network (CCDN 210) from the core clock to all its sequencing elements. Additional samplers 220 are inserted at a subset of the leaf nodes of this network. The positions of these samplers may be determined a priori during design time. The core clock is fed to the data input of these samplers and they are clocked by a separate sampling clock. The sampling clock is of a period which is slightly different from the core clock, and is fed to these locations by a sampling clock distribution network (SCDN 215).

The outputs of the samplers of these leaf nodes are of the beat period and are routed to a central measurement location for further analysis. Note that in this scheme, the core clock at the leaf nodes may be only minimally perturbed, thus preserving original skews. Additionally, the routing of the beat signals to the central measurement unit (e.g., a digital processor) may be done with a very relaxed timing constraint of a beat period. A multiplexer 225 can be used to select a pair of beat signals to determine their relative skews. Thus, relative skews between any two pairs of leaf nodes can be determined by selecting their respective signals at the multiplexor and feeding these signals to the digital processor.

Ideally, the sampling clock is distributed with zero skew or near-zero skew. However, doing so can be relatively easier than routing CCDN 210 to minimize skew. SCDN 215 may have orders of magnitude fewer elements, and therefore can be over-designed to have very low skews. Clock tree synthesis tools can be used to complete the SCDN 215 design, thus making it compatible with existing tool flows.

By observing the output waveforms from any leaf node, an estimate of the core clock edge occurrence can be obtained. Observations over many cycles will lead to better accuracy of this estimate. The estimates of the time of edge occurrence from two different leaves can then be compared to give an estimate of the average skew between the core clocks at the two leaf nodes.

With a zero skew or near-zero skew SCDN 215, various methods can be used to measure core clock skew at the leaf nodes. One embodiment is to embed an entire measurement unit at each leaf node. Alternatively, only a single digital sampler is added at each leaf node, and the outputs of these samplers are fed to multiplexor 225. Thus, without making a significant change to the design flow, clock skew can effectively and inexpensively be measured.

The techniques illustrated in FIGS. 1 and 2 may be used to measure clock skew between elements on a computer chip. In particular, the core clock and sampling clock signals may be generated on-chip or off-chip, and the multiplexor and digital processor may also be based on-chip or off-chip. This basic design can also be applied to any system in which a clock is distributed to multiple physical or logical elements. Thus, for instance, the techniques in FIGS. 1 and 2 can also be applied to measuring the clock skew between bit-lines on a parallel bus or between nodes in an electrical or optical interconnection network.

II. Measuring Clock Skew

The beat signal period for any beat cycle will typically be an integral multiple of the sampling clock cycles, as the beat signal edges are triggered by the sampling clock edges. Thus even the relative skew between two leaf clock beat signals will likely be an integral multiple of sampling clock cycles. Because of the jitter in the core clock and the sampling clock, a single measurement of this relative skew may or may not suffice for accurate measurements. Accordingly, a series of at least two measurements can be made, and the relative skew can be determined by averaging the measured core clock skew of this series.

In an embodiment, the clocks and the skews may be such that (1) the period of the core clock and sampling clock are invariant over the measurement window, and (2) the skew changes at a rate lower (by less than half) than the bandwidth of the measurement. Skews in the sampling clock or mismatches in the setup/hold time of the samplers will limit the measurement accuracy. However, these limitations can be overcome by using larger sized transistors and ensuring good rise times in the sampling clock network.

The effect of local mismatches can be reduced, as the random local variation reduces with the width and length of a transistor as $1/\sqrt{(\text{width})(\text{length})}$. For instance, a standard master-slave flip-flop with local within-die variation indicates maximum mismatch of 4 ps in the setup times at the rise time of 1 FO4 delay for the core and sampling clocks. But, by using transistors that are two to three times larger in the master stage of the flip-flop, the maximum variation reduces to 1 ps. Thus, by using a fine mesh CCDN, a skew within 1 ps can be achieved. A similar technique can be applied for the SCDN. Since the number of nodes in the SCDN is less than the number of nodes in the CCDN, this technique can be implemented with much less impact on total power. Even smaller skews can be resolved by using a small $\Delta T$ to achieve large amplifications.

Figure 3:
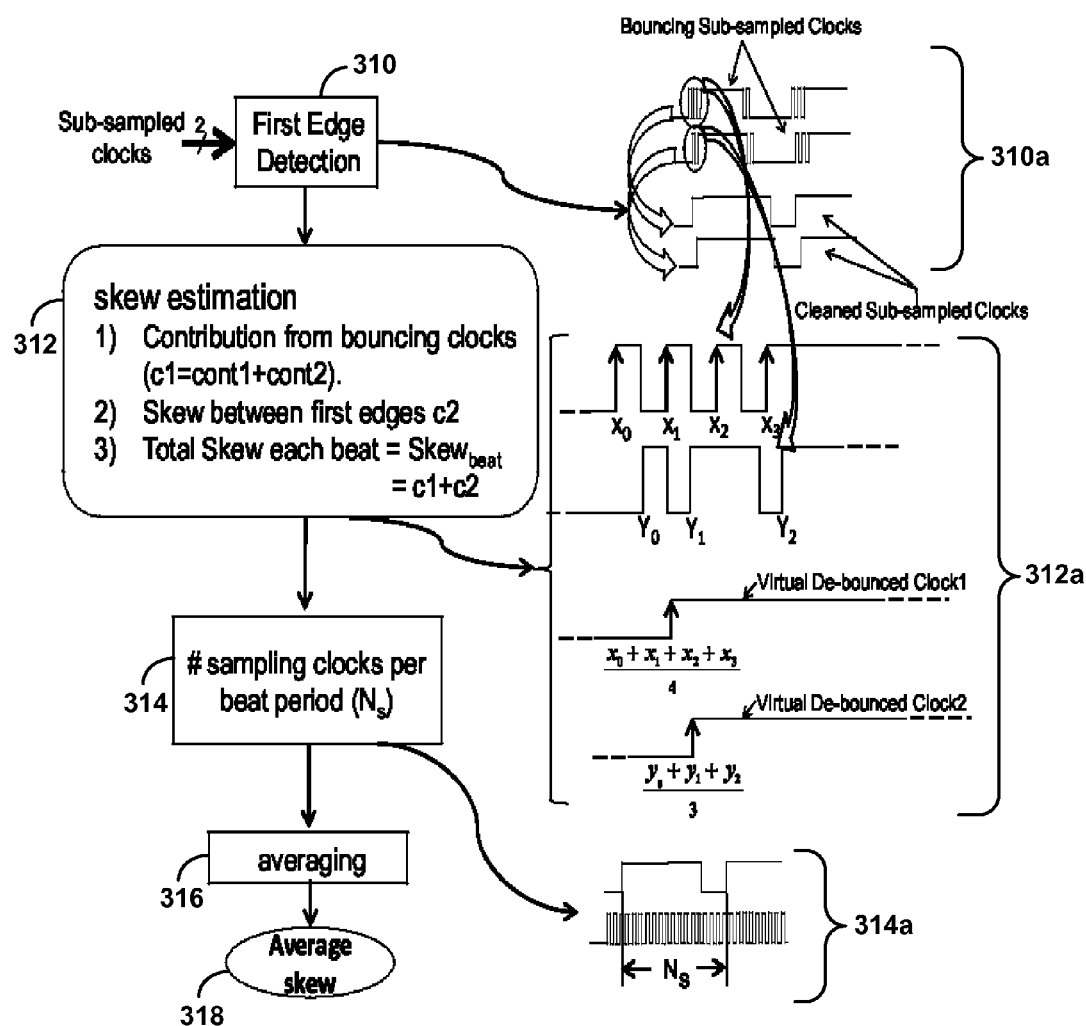
FIG. 3 depicts a method for determining an average skew between two sub-sampled signals.

However, clock signal jitter, coupled with small $\Delta T$, leads to bouncing in the beat signal near its transition edges as shown in FIG. 3 at 310a. Bouncing occurs when, during the transition of a signal from one value to another, the signal fluctuates between these values for a period of time. A bounced signal can reduce the accuracy of high-frequency clock measurements. To address this issue, a cleaned version of the sub-sampled signals can be generated. Various de-bouncing methods are possible. A simple de-bouncing technique is to use the first rising edge of a bouncy signal as the rising edge of a de-bounced version of the bouncy signal. However, an isolated bounce due to a momentary high/low value of $\Delta T$ can lead to inaccuracies in the skew measurement.

FIG. 3 depicts an example application of a de-bouncing technique according to the embodiments herein to determine the skew between two sub-sampled clocks, X and Y. At step 310, the first rising edge of clock X, $X_0$, and the first rising edge of clock Y, $Y_0$ for a given beat period, are detected. The skew, or delay, between these first rising edges is $Y_0-X_0$. The output of the first edge detect circuit may be made of 75% duty cycle to avoid false triggering within a beat by the rising edges corresponding to the falling edge glitches of bouncing sub-sampled clocks.

At step 312, the bouncing edges (312a) are detected. For clock X, the bouncing edges are $X_1$, $X_2$, and $X_3$. For clock Y, the bouncing edges are $Y_1$ and $Y_2$. The contribution from these bouncing edges towards the total time amplified skew in each beat is given as:

$$-\sum_{i=1}^{3} \frac{X_i - X_0}{4} \text{ for clock } X, \text{ and}$$

$$\sum_{j=1}^{2} \frac{Y_j - Y_0}{4} \text{ for clock } Y.$$

The time amplified skew per beat is estimated by adding these factors together as:

$$\text{skew\_per\_beat} = \sum_{j=0}^{2} \frac{Y_j}{3} - \sum_{i=0}^{3} \frac{X_i}{4}.$$

The number of sampling clocks per beat period, $N_S$, may be estimated at step 314 by dividing the length of the beat period by the length of the sampling clock period (314a), and this result can be used to determine the delay per sampling clock period:

$$R_{beat} = \frac{\text{skew\_per\_beat}}{N_S}$$

At step 316, the estimated value of $R_{beat}$, $E[R_{beat}]$, can be determined by calculating $R_{beat}$ for a large number of samples. The minimum number of samples used to estimate $R_{beat}$ can be based on the tolerance bound and the relative jitter of the clocks. Knowing the spread of $R_{beat}$, Hoeffding's inequality can be applied to estimate the minimum value of n, where $2^n$ samples are to be taken.

At step 318, $E[R_{beat}]$ is divided by the beat frequency, where the beat frequency is the frequency of the sampling clock subtracted from the frequency of the core clock. This result can be used to estimate the skew between clock X and clock Y. The choice of $\Delta T$, and the difference in frequencies of the core clock and sampling clock, can be used to adjust the accuracy of measurement in the form of time amplification, measurement time and the amount of bounce of the beat signals.

Figure 4:
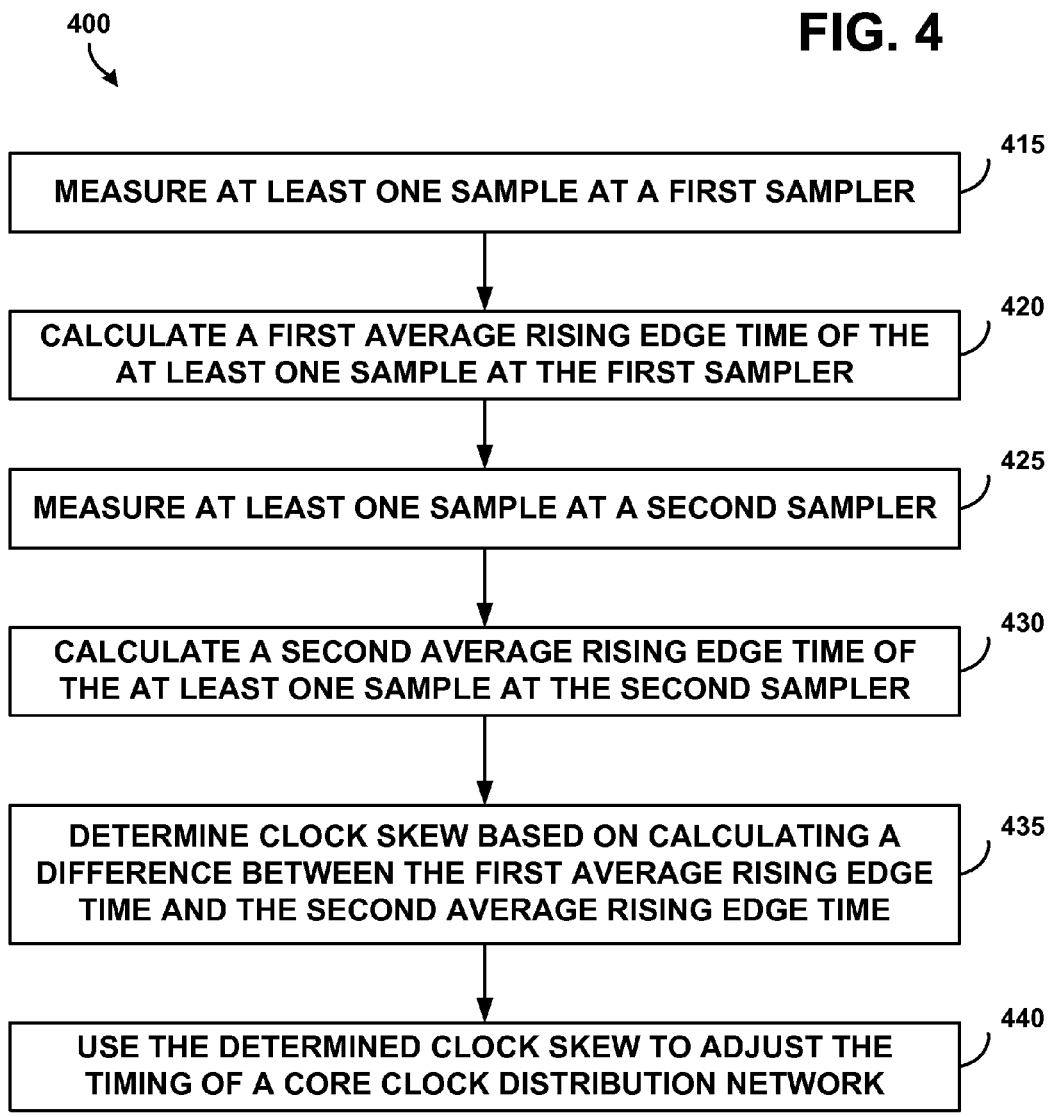
FIG. 4 depicts another method for determining an average skew between two sub-sampled signals.

A flow chart depicting an example de-bouncing method 400 is shown in FIG. 4. At step 415, at least one sample is measured at a first sampler, and at step 420, a first average rising edge time is calculated for the at least one sample measured at the first sampler. Similarly, at step 425, at least one sample is measured at a second sampler, and at step 430, a second average rising edge time is calculated for the at least one sample measured at the second sampler. At step 435, a clock skew is determined based on taking the difference between the first average rising edge time and the second average rising edge time.

Furthermore, the CCDN and SCDN can be arranged such that a multiplexor can select any sampled core clock signals at any two leaf nodes and feed these signals to a digital processor for further manipulation.

This determined clock skew can be used as an estimate of the clock skew between the clock signals at the first sampler and the second sampler, or the result of step 435 can be manipulated further to determine the clock skew. For example, the result of step 435 can be divided by an estimated number of sampling clocks per beat and/or a beat frequency. Furthermore, the steps of 415-435 can be performed for a number of iterations to increase the accuracy of the estimated clock skew.

Once the clock skew is determined, it can be used in a number of ways. The clock skew can be used purely as a measurement, it order to compare the skew between in the CCDN as various leaf nodes. Alternatively or additionally, at step 440, the determined clock skew can be used to adjust the timing of CCDN elements so that the clock skew of the system is further reduced. This may include adding or removing elements or delay lines from the system so that the clock signal flows more slowly or more rapidly to various leaf nodes.

It should be understood that these de-bouncing techniques are example embodiments, and other de-bouncing techniques, based on or similar to these techniques, can be used to determine the clock skew between two sub-sampled clocks. For instance, additional techniques may use more or fewer steps than described above, and these steps may be performed in a different order. Furthermore, the techniques illustrated by FIGS. 3 and 4 can be combined in part or in whole.

III. Experimental Design

Figure 5:
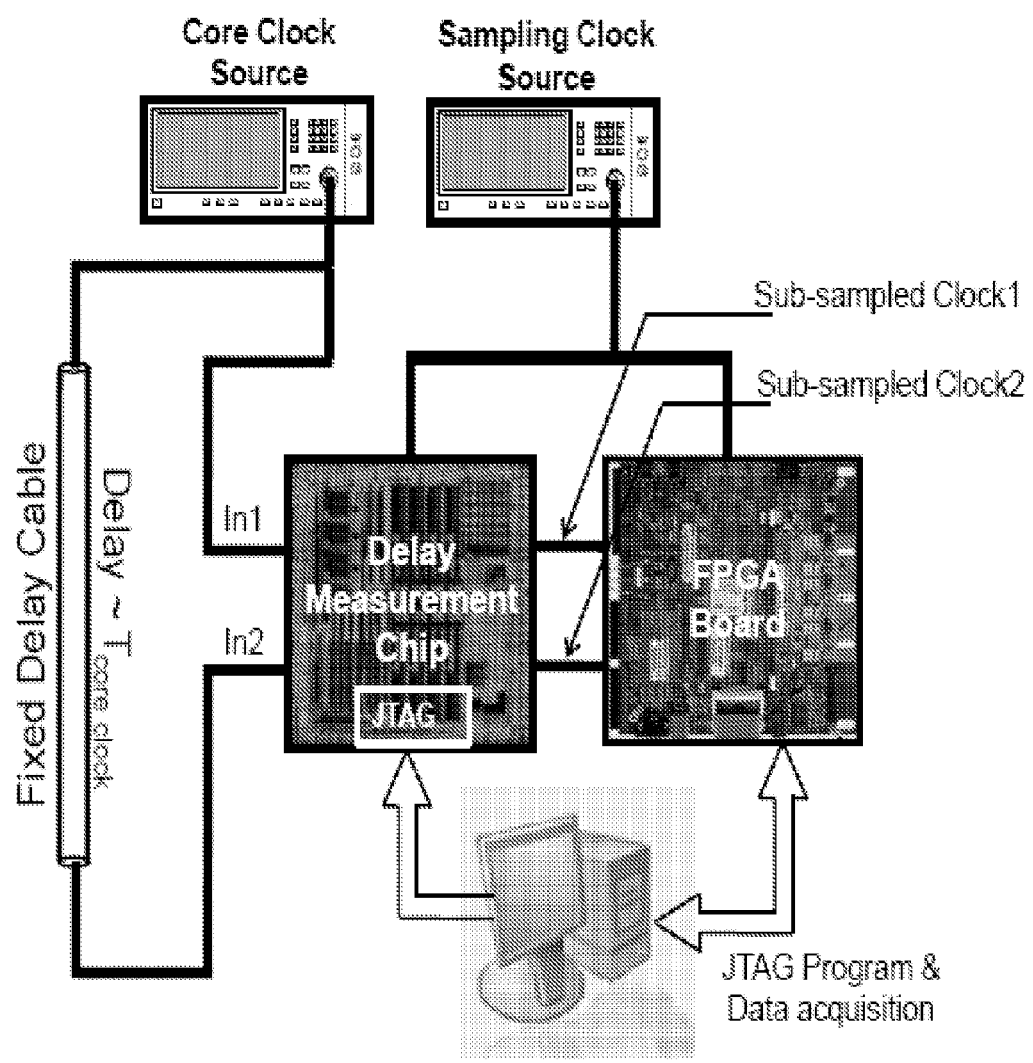
FIG. 5 depicts an example test environment for clock skew measurement according to preferred embodiments.
Figure 3:
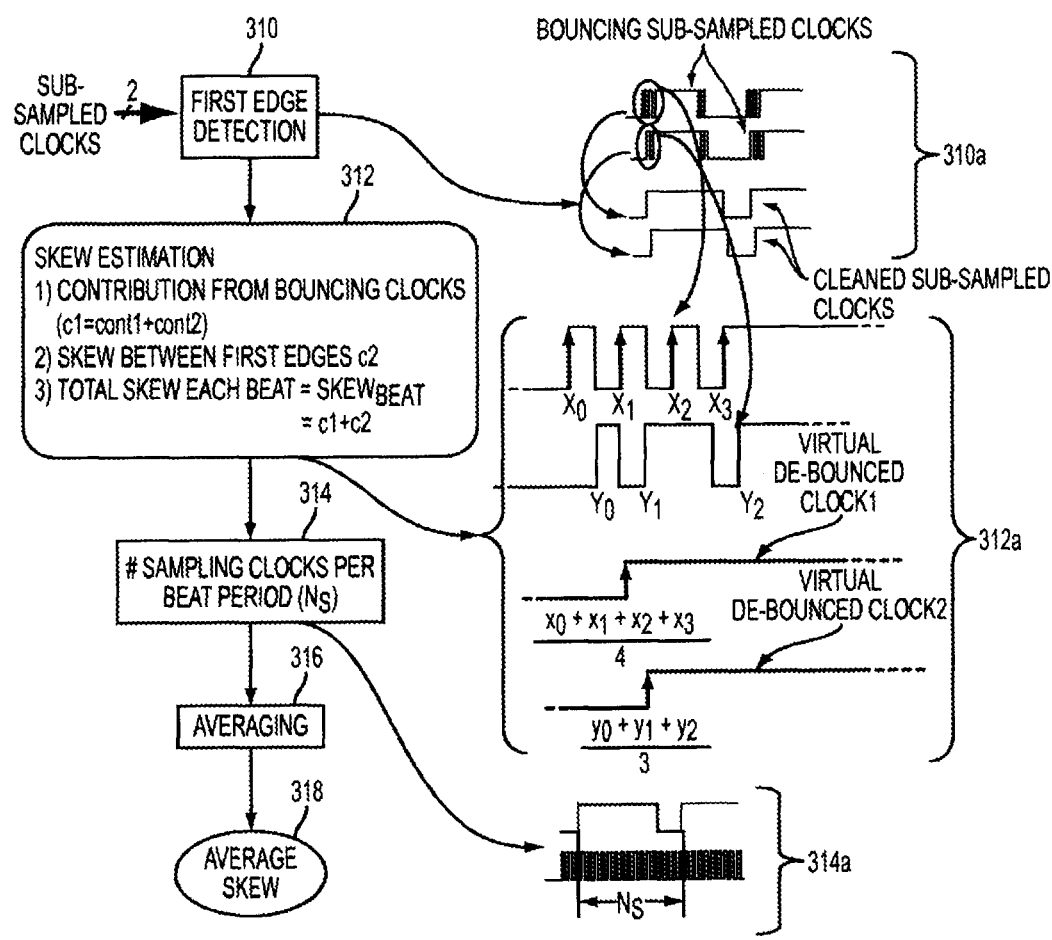

A computer chip can be fabricated to implement the techniques described above. The fabrication may use 65 nm processes, or other methods. A test environment for this computer chip is shown in FIG. 5. The test structure comprises of a number of samplers, and a multiplexer. Two leaf clock inputs, one representing the core clock for the computer chip and the other representing the sampling clock, may be supplied from outside the computer chip so that calibrated skews can be provided and the performance of the technique can be studied. Similarly, the sampling clock can also be provided from outside. The beat signal outputs from the multiplexers can be directly taken out of the chip, so that various de-bouncing methods and digital processing options can be experimented with in a flexible manner.

The core clock may be split so that one of the paths is taken through a cable of fixed delay, to provide the two leaf clock inputs to the computer chip. The beat output of the computer chip is fed to a field programmable gate array (FPGA) board where further processing is done to extract the input skews. Picosecond clock resolution delays can therefore be synthesizes using a cable of fixed length, and varying the core clock frequency.

It should be understood that this experimental design just one embodiment, and other elements and arrangements of elements can be used to measure the clock skew between two sub-sampled clocks. A flow chart 600 depicting a generic method for designing a computer chip to measure clock skew in accordance with preferred embodiments is shown in FIG. 6. At step 610, an SCDN is inserted into a computer chip containing a core clock and a CCDN. The SCDN distributes signals from a sampling clock, and the frequency of the sampling clock is asynchronous to that of the core clock. Thus, the frequency of the sampling clock may be greater than or lesser than that of the core clock.

At step 615, samplers are inserted at a first leaf node and at a second leaf node in the CCDN. The samplers sample the core clock signals distributed by the CCDN at the first leaf node and at the second leaf node at a frequency determined by the sampling clock. At step 620, a digital processor is inserted on the computer chip. The digital processor receives the output of the samplers and calculates a clock skew between the core clock signals as sampled at the first leaf node and the second leaf node. For instance, the clock skew calculation method of FIG. 4, or other methods, may be used.

Additionally, a multiplexor can be used to select sampled core clock signals at any two leaf nodes and feed these signals to the digital processor. In this way, the clock skew can be determined and used for further design and/or testing of the computer chip.

It should be understood that method 600 is an example embodiment, and other methods, based on or similar to method 600, can be used to determine the clock skew between two sub-sampled clocks. For instance, other methods may use more or fewer steps than described above, and these steps may be performed in a different order.

IV. Conclusion

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

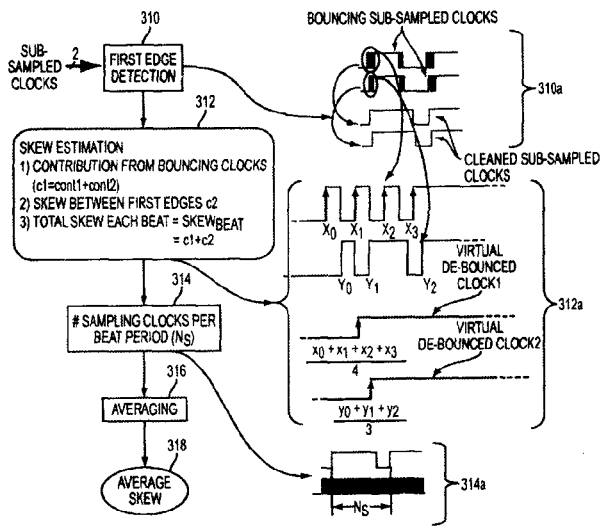
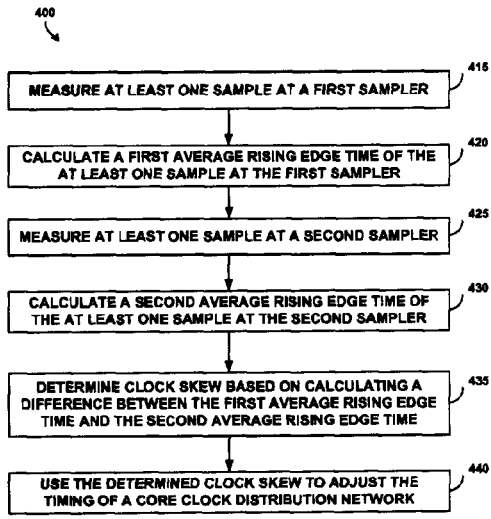

What is claimed is:

1. A computer chip comprising:
   a core clock;
   a core clock distribution network (CCDN), wherein the CCDN is configured to distribute signals from the core clock to a first leaf node and a second leaf node of the CCDN;
   a sampling clock distribution network (SCDN), wherein the SCDN is configured to distribute signals from a sampling clock to a first sampler configured to sample the core clock signal at the first leaf node, and to a second sampler configured to sample the core clock signal at the second leaf node; and
   a digital processor configured to receive an output from the first sampler and an output from the second sampler, measure at least one sample at the first sampler, calculate a first average rising edge time of the at least one sample measured at the first sampler, measure at least one sample at the second sampler, calculate a second average rising edge time of the at least one sample measured at the second sampler, and determine the clock skew based on calculating a difference between the first average rising edge time and the second average rising edge time.

2. The computer chip of claim 1, further comprising: the sampling clock.

3. The computer chip of claim 1, wherein the frequency of the sampling clock is greater than the frequency of the core clock.

4. The computer chip of claim 1, wherein the CCDN is configured to distribute core clock signals to a plurality of leaf nodes, wherein the first leaf node and the second leaf node are within the plurality of leaf nodes, wherein the SCDN is configured to distribute signals to a plurality of samplers, each sampler of the plurality of samplers associated with a leaf node of the plurality of leaf nodes, and wherein the first sampler and the second sampler are within the plurality of samplers, the computer chip further comprising:
a multiplexor communicatively coupled to the digital processor and to each sampler of the plurality of samplers, wherein the multiplexor is configured to receive a plurality of inputs, wherein each input from one of the plurality of samplers, wherein the multiplexor is configured to select an input from the first sampler and an input from the second sampler, and wherein the multiplexor is configured to transmit the two selected inputs to the digital processor.

5. The computer chip of claim 4, wherein the multiplexor is configured dynamically to select any two inputs from the plurality of inputs.

6. The computer chip of claim 1, further comprising:
a feedback module configured to receive the determined clock skew and to use the determined clock skew to adjust delay in a CCDN path between the core clock and the first leaf node, thereby reducing the clock skew.

7. A method, performed by a computer chip, for measuring a clock skew, wherein a core clock distribution network (CCDN) distributes signals from a core clock to a first leaf node and a second leaf node of the CCDN, wherein a sampling clock distribution network (SCDN) distributes signals from a sampling clock to a first sampler sampling the core clock signal at the first leaf node and a second sampler sampling the core clock signal at the second leaf node, the method comprising:
measuring at least one sample at the first sampler;
calculating a first average rising edge time of the at least one sample measured at the first sampler;
measuring at least one sample at the second sampler;
calculating a second average rising edge time of the at least one sample measured at the second sampler;
determining, by the computer chip, the clock skew based on calculating a difference between the first average rising edge time and the second average rising edge time; and
using the determined clock skew to adjust the timing of the CCDN.

8. The method of claim 7, wherein the first leaf node, the second leaf node, the first sampler, and the second sampler are located on the computer chip, and the clock skew is measured between elements on the computer chip.

9. The method of claim 7, wherein the sampling clock is located off of the computer chip, wherein the sampling clock is communicatively coupled to the computer chip to distribute signals from the sampling clock to the SCDN.

10. The method of claim 7, wherein the first average rising edge time, the second average rising edge time, and the difference between the first average rising edge time and the second average rising edge time are calculated by a digital processor, wherein the digital processor is communicatively coupled to the output of the first sampler and to the output of the second sampler.

11. The method of claim 10, wherein the digital processor is located on the computer chip.

12. The method of claim 10, wherein the digital processor is located off of the computer chip.

13. The method of claim 7, wherein the CCDN distributes core clock signals to a plurality of leaf nodes, wherein the first leaf node and the second leaf node are within the plurality of leaf nodes, wherein the SCDN comprises distributes signals to a plurality of samplers, each sampler of the plurality of samplers associated with a leaf node of the plurality of leaf nodes, wherein the first sampler and the second sampler are within the plurality of samplers, and wherein a multiplexor is communicatively coupled to the digital processor and to each sampler of the plurality of samplers, the method further comprising:
at the multiplexor, receiving a plurality of inputs, wherein each input from one of the plurality of samplers;
at the multiplexor, selecting an input from the first sampler and an input from the second sampler; and
at the multiplexor, transmitting the two selected inputs to the digital processor.

14. The method of claim 13, wherein the multiplexor can be configured dynamically to select any two inputs from the plurality of inputs.

15. The method of claim 7, wherein the frequency of the sampling clock is greater than the frequency of the core clock.

16. The method of claim 7, wherein adjusting the timing of the CCDN comprises adjusting delay in a CCDN path between the core clock and the first leaf node, thereby reducing the clock skew.

17. The method of claim 7, wherein the clock skew is measured between bit-lines on a parallel bus.

18. A method for designing a computer chip that measures its own clock skew, wherein the computer chip comprises a core clock and a core clock distribution network (CCDN), wherein the CCDN distributes signals from the core clock to a first leaf node and a second leaf node of the CCDN, the method comprising:
inserting a sampling clock distribution network (SCDN) into the computer chip, wherein the SCDN distributes signals from a sampling clock, and wherein the frequency of the sampling clock is asynchronous to the frequency of the core clock;
inserting samplers at the first leaf node and at the second leaf node, wherein the samplers sample the core clock signals distributed by the CCDN at the first leaf node and at the second leaf node at a frequency determined by the sampling clock; and
inserting a digital processor on the computer chip, wherein the digital processor receives the output of the samplers and calculates a clock skew between the core clock signals as sampled at the first leaf node and the second leaf node, wherein the calculation of the clock skew comprises:
measuring one or more samples at the first leaf node to determine rising edge times associated with each sample,
calculating a first average rising edge time for the two or more samples at the first leaf node,
measuring one or more samples at the second leaf node to determine rising edge times associated with each sample, calculating a second average rising edge time for the two or more samples at the second leaf node, and calculating the clock skew based on a difference of the first average rising edge time and the second average rising edge time.

19. The method of claim 18, further comprising:

using the calculated clock skew to adjust the timing of the CCDN, wherein adjusting the timing of the CCDN comprises adjusting delay in a CCDN path between the core clock and the first leaf node, thereby reducing the clock skew.

\* \* \* \* \*

UNITED STATES PATENT AND TRADEMARK OFFICE
CERTIFICATE OF CORRECTION

| | |
|---|---|
| PATENT NO. | : 8,443,330 B2 |
| APPLICATION NO. | : 12/511607 |
| DATED | : May 14, 2013 |
| INVENTOR(S) | : Amrutur et al. |

It is certified that error appears in the above-identified patent and that said Letters Patent is hereby corrected as shown below:

On the title page, in the Figure, delete " 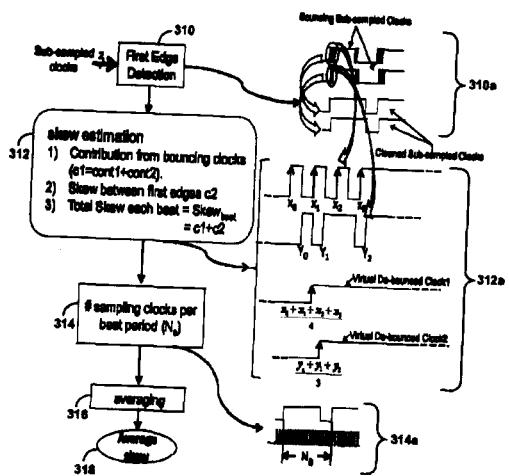 " and insert -- 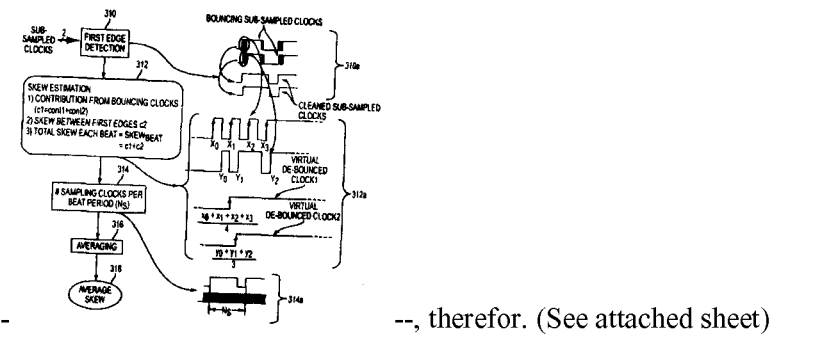 --, therefor. (See attached sheet)

Signed and Sealed this
Thirty-first Day of December, 2013

Margaret A. Focarino
*Commissioner for Patents of the United States Patent and Trademark Office*

CERTIFICATE OF CORRECTION (continued)
U.S. Pat. No. 8,443,330 B2

In the drawings:

In Fig. 3, Sheet 3 of 6, replace Figure with the attached Replacement Sheet.

In the specification:

In Column 5, Line 17, after Equation, insert -- . --.

(12) United States Patent
Amrutur et al.

(10) Patent No.: US 8,443,330 B2
(45) Date of Patent: May 14, 2013

(54) METHODS AND SYSTEMS FOR MEASURING AND REDUCING CLOCK SKEW USING A CLOCK DISTRIBUTION NETWORK

(75) Inventors: Bharadwaj Amrutur, Bangalore (IN); Pratap Kumar Das, Bangalore (IN)

(73) Assignee: Indian Institute of Science—Bangalore, Karnataka (IN)

( * ) Notice: Subject to any disclaimer, the term of this patent is extended or adjusted under 35 U.S.C. 154(b) by 316 days.

(21) Appl. No.: 12/511,607

(22) Filed: Jul. 29, 2009

(65) Prior Publication Data

US 2011/0025391 A1   Feb. 3, 2011

(51) Int. Cl.
   *G06F 17/50*   (2006.01)
(52) U.S. Cl.
   USPC ............ 716/136; 716/108; 716/113; 716/134
(58) Field of Classification Search .................. 716/108, 716/113, 134, 136
   See application file for complete search history.

(56) References Cited

U.S. PATENT DOCUMENTS 7,573,957 B2 *   8/2009   Sartschev et al. ............. 375/342
7,933,761 B2 *   4/2011   Hollis ........................... 703/19

OTHER PUBLICATIONS

Friedman, "Clock Distribution Networks in Synchronous Digital Integrated Circuits," Proceedings of the IEEE, vol. 89, No. 5, May 2001.

Mahoney et al., "16.1 Clock Distribution on a Dual-Core, Multi-Threaded Itanium®-Family Processor," IEEE International Solid-State Circuits Conference, Session 16, Feb. 2005.
Lee and Abide, "A 9 b, 1.25 ps Resolution Coarse-Fine Time-to-Digital Converter in 90 nm CMOS that Amplifies a Time Residue," IEEE Journal of Solid-State Circuits, vol. 43, No. 4, Apr. 2008.
Gutnik and Chandrakasan, "On-chip picosecond time measurement," 2000 Symposium on VLSI Circuits Digest of Technical Papers, 2000.
Abas et al., "Built-in time measurement circuits—a comparative design study," IET Comput. Digit. Tech., 1, (2), 2007.
Sanda et al., "WA 21.7 Picosecond Imaging Circuit Analysis of the POWER3 Clock Distribution," 1999 IEEE International Solid-State Circuits Conference, Session 21, 1999.
Zheng and Shepard, "On-Chip Oscilloscopes for Noninvasive Time-Domain Measurement of Waveforms in Digital Integrated Circuits," IEEE Transactions on Very Large Scale Integration (VLSI) Systems, vol. 11, No. 3, Jun. 2003.
Arnaud et al., "Low Cost 65nm CMOS Platform for Low Power & General Purpose Applications," 2004 Symposium on VLSI Technology Digest of Technical Papers, 2004.
Yeh et al., "Clock Distribution Architectures: A Comparative Study," Proceedings of the 7th International Symposium on Quality Electronic Design (ISQED'06), IEEE Computer Society, 2006.
Hoeffding, "Probability Inequalities for Sums of Bounded Random Variables," Journal of the American Statistical Association, vol. 58, No. 301, Mar. 1963.

(Continued)

*Primary Examiner* — Vuthe Siek
(74) *Attorney, Agent, or Firm* — Steven S. Rubin, Esq.; Moritt Hock & Hamroff LLP

(57) ABSTRACT

A technique for a delay measurement system to measure the skews in a clock distribution network is presented. It uses the principle of sub-sampling to measure and amplify small clock skews and determine an estimate of clock skew by further manipulation if these sampled measurements. The technique can be applied to measure clock skew on a computer chip, between bit-line of a communication bus, or between elements connected by an electronic or optical interconnect.

19 Claims, 6 Drawing Sheets